(12) United States Patent
Kohno

(10) Patent No.: US 7,746,439 B2
(45) Date of Patent: Jun. 29, 2010

(54) MOUNTING FILM FOR LIQUID CRYSTAL DISPLAY DRIVE CHIP AND METHOD FOR MANUFACTURING THE SAME

(75) Inventor: Akifumi Kohno, Kanagaw-Ken (JP)

(73) Assignee: InfoVision Optoelectronics Holdings Limited, Tortola (VG)

(*) Notice: Subject to any disclaimer, the term of this patent is extended or adjusted under 35 U.S.C. 154(b) by 277 days.

(21) Appl. No.: 11/871,868

(22) Filed: Oct. 12, 2007

(65) Prior Publication Data

US 2008/0088768 A1    Apr. 17, 2008

(30) Foreign Application Priority Data

Oct. 16, 2006    (JP)    .............................. 2006-281036

(51) Int. Cl.
G02F 1/1345    (2006.01)
(52) U.S. Cl. ...................................... 349/150; 349/158
(58) Field of Classification Search .................. 349/150
See application file for complete search history.

(56) References Cited

U.S. PATENT DOCUMENTS

2006/0109394 A1*    5/2006    Miyagawa et al. ............ 349/58
2007/0013824 A1*    1/2007    Yu et al. ....................... 349/58

* cited by examiner

*Primary Examiner*—Richard H Kim
(74) *Attorney, Agent, or Firm*—Connolly Bove Lodge & Hutz LLP

(57) ABSTRACT

The present invention provides a mounting film for a liquid crystal display drive chip and a method for manufacturing the same. The mounting film is provided with a slit cut from a side edge thereof, or provided with a weakened line for forming the slit. When a distance between a liquid crystal display panel and a control circuit substrate of the liquid crystal display unit is un-uniform, the opening degree of the slit is variable accordingly to accommodate variations in the distance. Such a COF mounting film for a liquid crystal display drive chip may be generally used even though a distance between the liquid crystal display panel and the control circuit substrate varies slightly. Therefore, the manufacturing cost of the liquid crystal display unit may be reduced.

12 Claims, 4 Drawing Sheets

MOUNTING FILM FOR LIQUID CRYSTAL DISPLAY DRIVE CHIP AND METHOD FOR MANUFACTURING THE SAME

CROSS-REFERENCES TO RELATED APPLICATIONS

This application claims the benefit of Japanese Patent Application No. 2006-281036 filed on Oct. 16, 2006.

FIELD OF THE INVENTION

The present invention relates to a manufacturing technology for electronic display unit. More particularly, the present invention relates to a mounting film for a liquid crystal display drive chip and a method for manufacturing the same.

BACKGROUND OF THE INVENTION

Recently, drive circuits for driving liquid crystal cells in form of semiconductor chips are mounted on films. Conventionally, the film equipped with the semiconductor chip (COF, chip on film, also referred to as "COF mounting film for a liquid crystal display drive chip" hereinafter) is arranged between a liquid crystal display panel and a control circuit substrate.

FIG. 10 schematically shows that COF mounting films for liquid crystal display drive chips are provided between a liquid crystal display panel and a control circuit substrate.

In FIG. 10, a reference numeral 102 is used to denote a liquid crystal display panel, 103 is used to denote a control circuit substrate, 111, 112 and 113 are used to denote COF mounting films for liquid crystal display drive chips, while W1, W2 and W3 represent distances between the control circuit substrate 103 and the liquid crystal display panel 102.

In the case that W1, W2 and W3 are identical with each other, identical COF mounting films for liquid crystal display drive chips 111, 112 and 113 may be used. However, in prior art, if the distance between the control circuit substrate 103 and the liquid crystal display panel 102 vary with position, COF mounting films for liquid crystal display drive chips, which are differently shaped, are needed at different positions. This will be explained in more detail hereinafter with reference to accompany drawings.

FIG. 2 is a schematic plan view which illustratively shows that COF mounting films for liquid crystal display drive chips with different shapes are employed when the distance between the control circuit substrate and the liquid crystal display panel varies with position.

In FIG. 2, 103 is used to denote a control circuit substrate, 111, 112 and 113 are used to denote COF mounting films for liquid crystal display drive chips, 102 is used to denote a liquid crystal display panel, while W1, W2 and W3 represent the distances between the control circuit substrate 103 and the liquid crystal display panel 102.

As shown in FIG. 2, the shape of these COF mounting films for liquid crystal display drive chips 111, 112 and 113 needs to be varied accordingly to accommodate the distances W1, W2 and W3.

Accordingly, in the case that the distance between the control circuit substrate 103 and the liquid crystal display panel 102 is un-uniform, such as in the case of a liquid crystal display unit with a curved display panel, COF mounting films for liquid crystal display drive chips need to be provided between the curved liquid crystal display panel and the flat control circuit substrate. In such a case, COF mounting films for liquid crystal display drive chips with different shapes are needed since the distances between the curved liquid crystal display panel and the flat control circuit substrate vary slightly at different positions.

FIG. 3 is a perspective view illustrating that COF mounting films for liquid crystal display drive chips are arranged between the curved liquid crystal display panel and the flat control circuit substrate. In FIG. 3, 102 is used to denote the liquid crystal display panel, and W31, W32 and W33 represent the distances between the control circuit substrate and the liquid crystal display panel. The distances W31, W32 and W33 are slightly different from each other since the liquid crystal display panel in FIG. 3 is curved. Therefore, the shape for those COF mounting films for liquid crystal display drive chips, which are provided to engage the control circuit substrate 103 with the liquid crystal display panel 102, needs to be slightly varied.

However, in such a situation, the manufacturing cost will increase markedly due to preparation of various COF mounting films for liquid crystal display drive chips with different shapes and selection of COF mounting films for liquid crystal display drive chips with suitable shapes.

The related art is disclosed in Japanese patent application publication No. H06-18914. The document is entirely incorporated herein by reference.

SUMMARY OF THE INVENTION

Therefore, an object of the present invention is to provide a mounting film for a liquid crystal display drive chip and a method for manufacturing the same, such that the COF mounting film for liquid crystal display drive chip may be generally used even though a distance between a liquid crystal display panel and a control circuit substrate varies slightly with position.

According to one aspect of the present invention, there is provided with a mounting film for a liquid crystal display drive chip, wherein the mounting film is provided with a slit cut from a side edge thereof; and when a distance between a liquid crystal display panel and a control circuit substrate of the liquid crystal display unit is un-uniform, the opening degree of the slit may vary accordingly to accommodate variations in the distance.

More preferably, the mounting film is rectangular, and the slit is provided on either of the two side edges, which are arranged between the liquid crystal display panel and the control circuit substrate, of the rectangular mounting film.

More preferably, a hole is provided at the tip of the slit.

More preferably, the slit is substantially parallel to an engaging side edge of the mounting film with the liquid crystal display panel or the control circuit substrate.

More preferably, a region around the slit is coated with solder resist and/or provided with dummy wirings such that the slit may be optimized.

According to another aspect of the present invention, the mounting film is provided with a weakened line. When forces are applied to the mounting film, a slit will be formed in the mounting film along the weakened line. Also, when a distance between a liquid crystal display panel and a control circuit substrate of the liquid crystal display unit varies with position, the opening degree of the slit may vary accordingly to accommodate variations in the distance.

More preferably, the mounting film is rectangular. One end of the weakened line is provided on either of the two side edges, which are arranged between the liquid crystal display panel and the control circuit substrate, of the rectangular mounting film.

More preferably, a hole is provided at the tip of the weakened line.

More preferably, the weakened line is substantially parallel to an engaging side edge of the mounting film with the liquid crystal display panel or the control circuit substrate.

More preferably, a region around the weakened line is coated with solder resist and/or provided with dummy wirings such that the slit formed along the weakened line may be optimized.

According to a further aspect of the present invention, there is provided with a method for manufacturing a mounting film for a liquid crystal display drive chip, comprising forming a slit cut from a side edge of the mounting film; wherein the edge is arranged between a liquid crystal display panel and a control circuit substrate.

More preferably, the slit is configured to be substantially parallel to an engaging side edge of the mounting film with the liquid crystal display panel or the control circuit substrate.

More preferably, the mounting film is preformed to be rectangular, and the slit is provided on either of the two side edges, which are arranged between the liquid crystal display panel and the control circuit substrate, of the rectangular mounting film.

More preferably, the method further comprises providing a hole at the tip of the slit.

More preferably, the method further comprises coating solder resist and/or providing dummy wirings around the slit such that the slit may be reinforced.

According to a yet aspect of the present invention, there is provided with a method for manufacturing a mounting film for a liquid crystal display drive chip, comprising forming a weakened line on the mounting film for liquid crystal display drive chip, such that a slit is formed along the weakened line when forces are applied to the mounting film.

More preferably, the mounting film is preformed to be rectangular. One end of the weakened line is provided on either of the two side edges, which are arranged between the liquid crystal display panel and the control circuit substrate, of the rectangular mounting film.

More preferably, the weakened line is configured to be substantially parallel to an engaging side edge of the mounting film with the liquid crystal display panel or the control circuit substrate.

More preferably, the method further comprises providing a hole at the tip of the weakened line.

More preferably, the method further comprises coating solder resist and/or providing dummy wirings around the weakened line such that the slit formed along the weakened line may be reinforced.

According to a still further aspect, there is provided with A mounting film for a liquid crystal display drive chip, having a substantial rectangular shape with a pair of opposite longitudinal edges and a pair of opposite latitudinal edges, the film comprising:

a pair of opposite interface regions located near to the opposite longitudinal edges, respectively;

a region for mounting on the liquid crystal display drive chip;

a wiring region for electrically connecting the liquid crystal display drive chip and the interface regions;

wherein a pair of slits or weakened lines are provided at the opposite latitudinal edges respectively and outside of the interface regions and the wiring region, an extending direction of the slits or weakened lines is substantially parallel to the longitudinal edges.

More preferably, when applying a moderate force on the film along a longitudinal direction, a length of the film in the longitudinal direction is variable due to the opening of the slits or the weakened lines being broken to form the slits.

More preferably, a hole is formed at the tip of each slit or weakened line.

According to the present invention, the same COF mounting film for liquid crystal display drive chip may be generally used in case that the distance between the liquid crystal display panel and the control circuit substrate varies slightly with position, so as to connecting the liquid crystal display panel with the control circuit substrate. Therefore, the manufacturing cost of the liquid crystal display unit may be reduced.

REFERENCE NUMERALS

102—liquid crystal display panel; 103—control circuit substrate; 104—hole at the tip of the slit; 105—slit; 106—drive chip; 112—COF mounting film for a liquid crystal display drive chip; 121—line that is substantially parallel to the engaging side of the liquid crystal display panel with the COF mounting films for drive chips; W11, W12 and W13—distance between the control circuit substrate and the liquid crystal display panel at different positions.

DETAILED DESCRIPTION OF THE INVENTION

Embodiments of the present invention will be described hereinafter with reference to accompany drawings.

Figure 1:
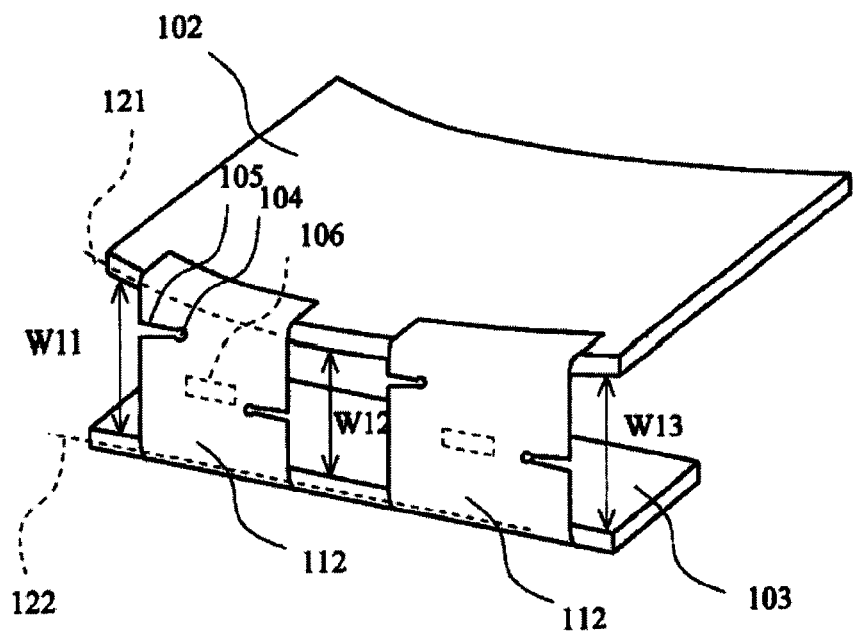
FIG. 1 is a perspective view which illustratively shows COF mounting films for liquid crystal display drive chips according to one embodiment of the present invention and the arrangement thereof.

FIG. 1 is a perspective view which illustratively shows COF mounting films for liquid crystal display drive chips according to one embodiment of the present invention and the arrangement thereof.

Figure 2:
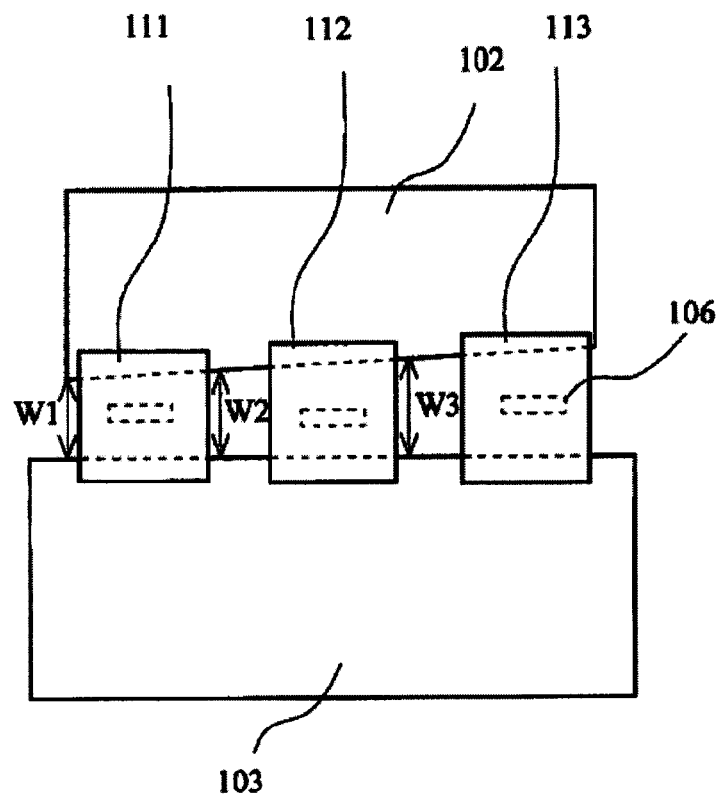
FIG. 2 is a schematic plan view which illustratively shows that COF mounting films for liquid crystal display drive chips with different shapes are employed when a distance between a control circuit substrate and a liquid crystal display panel varies with position.
Figure 3:
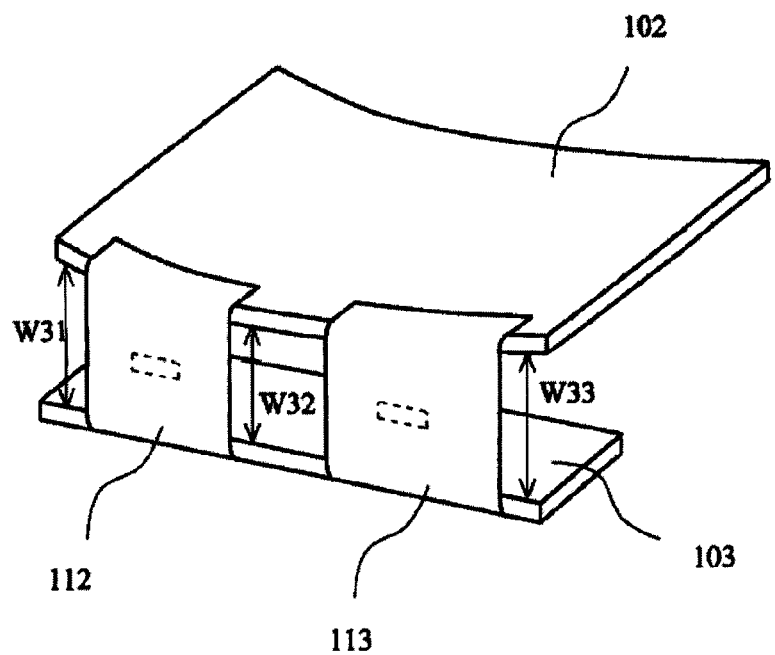
FIG. 3 is a schematic perspective view illustrating that COF mounting films for liquid crystal display drive chips are arranged between a curved liquid crystal display panel and a flat control circuit substrate.
Figure 10:
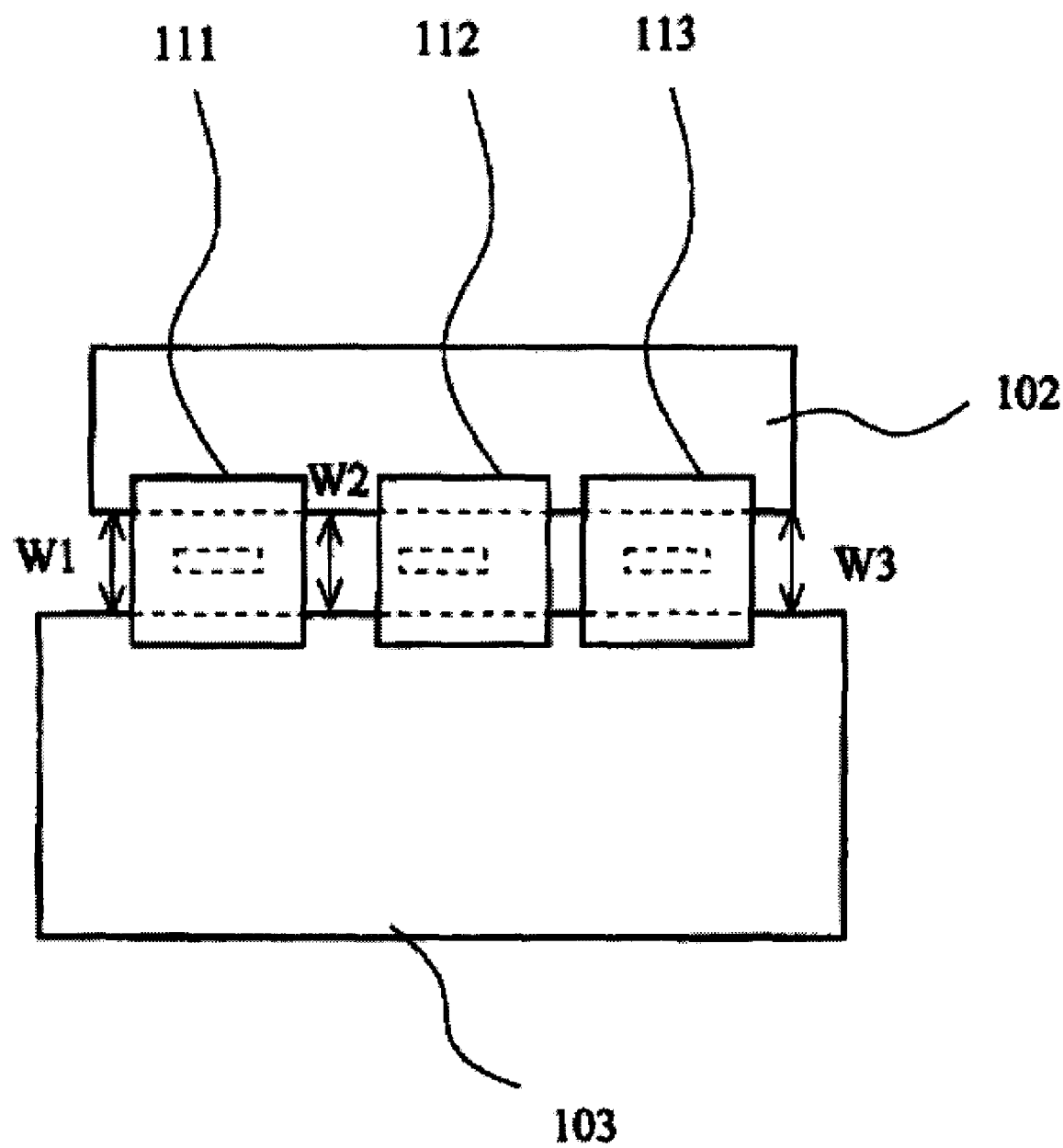
FIG. 10 illustratively shows that COF mounting films for liquid crystal display drive chips are provided between a liquid crystal display panel and a control circuit substrate.

In FIG. 1, a reference numeral 103 refers to a control circuit substrate, 102 refers to a liquid crystal display panel, 112 refers to a COF mounting film for a liquid crystal display drive chip, W11, W12 and W13 refer to different distances between the control circuit substrate and the liquid crystal display panel, 105 refers to a slit, 104 refers to a hole at the tip of the slit, 106 refers to a drive chip which is semiconductor chip, 121 refers to a line that is substantially parallel to an engaging side of the liquid crystal display panel 102 with the COF mounting films for liquid crystal display drive chips, and 122 refers to a line that is substantially parallel to an engaging side of the control circuit substrate 103 with the COF mounting films for liquid crystal display drive chips. Besides, the drive chips 106 are depicted with dash lines since these drive chips 106 are installed inside of the films. Similarly, drive chips 106 in FIGS. 2, 3 and 10 are also depicted with dash lines.

The COF mounting films for liquid crystal display drive chips 112 according to one embodiment of the present invention each is provided with a slit 105 and a circular hole is defined at the tip of the slit 105. With adjusting the opening degree of the slit, identical COF mounting films for liquid crystal display drive chips may be arranged between the liquid crystal panel and the control circuit substrate, even though the distance between the liquid crystal panel and the control circuit substrate varies with position. Furthermore, the film material around the slit is prevented from cranking caused by stress concentration, since the circular hole provided at the tip of the slit may disperse stresses in this region regardless of the slit is opened or closed.

The slit is preferably cut along a direction that is substantially parallel to the engaging side of the liquid crystal display panel 102 with the COF mounting films for liquid crystal display drive chips. Alternatively, the slit may be cut along a direction that is substantially parallel to the engaging side of the control circuit substrate 103 with the COF mounting films for liquid crystal display drive chips. Therefore, the slit may be opened according to the variation of the distance between the liquid crystal display panel and the control circuit substrate.

More preferably, equal-numbered slits are respectively provided on the two opposite, non-engaging sides of the COF mounting films for liquid crystal display drive chips, i.e., the two sides which do not engage with either the liquid crystal display panel 102 or the control circuit substrate 103. Therefore, variation of the distance at the two opposite sides may be equally accommodated by opening and closing of respective slits.

Hereinafter, a method for manufacturing a COF mounting film for a liquid crystal display drive chips will be described. The description will be only directed to a characterizing part thereof.

Figure 4:
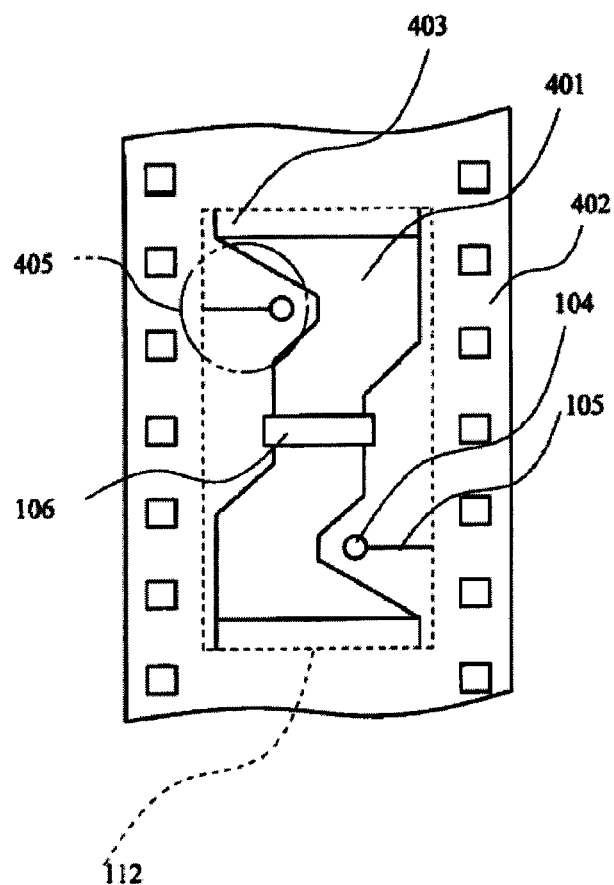
FIG. 4 is a partial plan view which illustratively shows how a COF mounting film for a liquid crystal display drive chip according to one embodiment of the present invention is formed with a base film.

FIG. 4 is a partial plan view which illustratively shows how a COF mounting film for a liquid crystal display drive chip according to one embodiment of the present invention is formed with a base film.

In FIG. 4, 402 refers to a base film, 106 refers to the drive chip, 401 refers to a region provided with wire layouts for electrically connecting to I/O terminals of the drive chip 106 and I/O terminals of the COF mounting film for liquid crystal display drive chip, i.e., wiring region, 104 refers to the hole at the tip of the slit, 105 refers to the slit, 112 refers to the COF mounting films for liquid crystal display drive chips, and 403 refers to a region where the I/O terminals of the COF mounting film for liquid crystal display drive chip are provided, i.e., interface region.

The slit is formed in the base film 402 at the region which is outside of the region 401 and also outside of the region 403 and the direction of the slit is substantially parallel to that of the region 403 where an I/O pad is provided.

As to methods for forming the slit, it can be envisaged that a weakened line is preformed. That is to say, the slit is not physically cut. Instead, when needed, moderate forces may be applied to break the weakened line so as to form the slit. This embodiment is advantageous in that: it is quite difficult to mount a drive chip on the film provided with a cut or opened slit; however, mounting a drive chip on the film provided with a weakened line is relatively simply. The drive chip may be mounted even though the film has been provided with the weakened line. Therefore, the procedure of providing the weakened line may be carried out prior to or after the mounting procedure of the drive chip, thus increasing a degree of freedom in the manufacturing process. Furthermore, as compared with the case of forming a cut or opened slit, only providing a weakened line is relatively easy to perform connection operation during the COF mounting film for liquid crystal display drive chip is mounted on the substrate.

By the way, for the case where the slit is physically cut on the film, this slit needs to be formed after the drive chip has been mounted onto the film.

The shape of the slit will be described further hereinafter.

FIGS. 5 to 9 are partial plan views illustrating various shapes and configurations of the slit 405 in FIG. 4.

Figure 5:
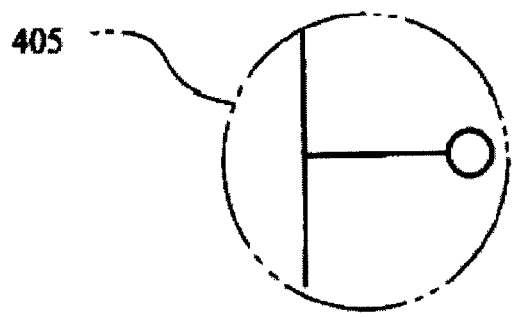
FIG. 5 is a partial plan view which illustratively shows a linear, continuous slit.

FIG. 5 is a partial plan view illustrating a closed slit in case where no forces are applied to the COF film.

Figure 6:
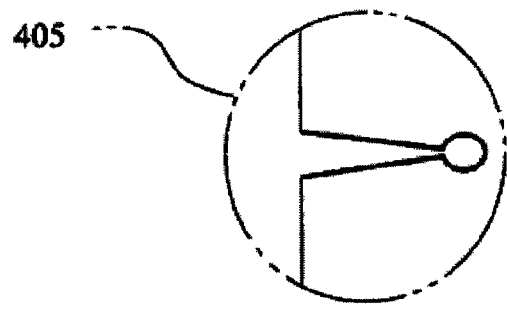
FIG. 6 is a partial plan view which shows that the slit is opened by forces applied to the COF film.

FIG. 6 is a partial plan view illustrating an opened slit in case where forces are applied to the COF film.

Figure 7:
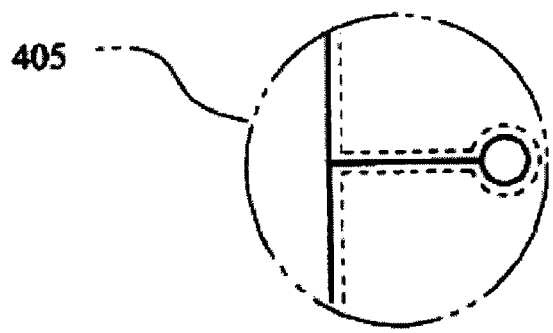
FIG. 7 is a partial plan view which shows a reinforced slit as well as a reinforced hole at the tip of the slit.

FIG. 7 is a partial plan view illustrating an optimized slit and an optimized hole at the tip thereof.

The optimized method lies in that a region around the slit and the hole at the tip of the slit is coated with solder resist or provided with dummy wirings. These provisions of the solder resist or dummy wirings may optimize the slit region. Furthermore, it may incorporate the procedure for coating the solder resist or providing dummy wirings into current manufacturing process, without offering a further procedure. Thus, the manufacturing cost of the COF film will be not increased.

Figure 8:
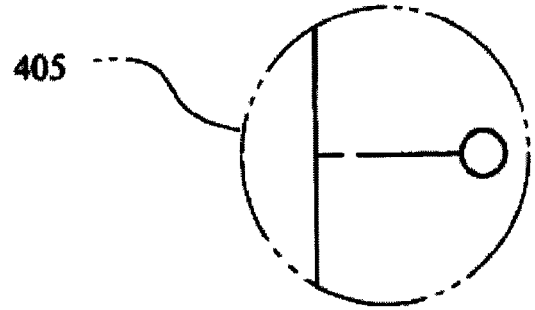
FIG. 8 is a partial plan view which shows that the slit is not completely cut open.

FIG. 8 is a partial plan view which shows the slit is not completely cut open.

When the slit is not completely cut open, its presence will not adversely affect the mounting of the drive chip. Furthermore, when the COF mounting film for a liquid crystal display drive chip is used to perform a connection operation, a slit not completely cut open may facilitate the connection operation.

Figure 9:
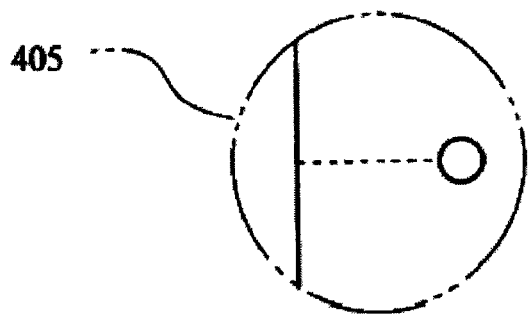
FIG. 9 is a partial plan view which shows the slit with a hole at the tip thereof, wherein the slit is defined as a weakened line which is not be cut open completely.

FIG. 9 is a partial plan view which shows the slit is provided with a hole at the tip thereof, wherein the slit is formed as weaken line rather than completely cut open.

In such a case, the drive chip may be mounted even after the weakened line has been provided.

Besides, formation of the slit and weakened line as well as manufacturing of the COF mounting film for a liquid crystal display drive chip according to one embodiment of the present invention are well known to those skilled in the art. Therefore, a detailed description is omitted. Furthermore, the COF film is made of conventional materials, such as polyimide.

Obviously, the present invention is not limited to providing COF films between a liquid crystal display panel and a control circuit substrate; it may also be applied to providing COF films between two substrates separated by a variable distance, with the COF film is arranged between the two substrates.

The embodiment described above is merely used to explain the principle of the invention. It can be appreciated that the present invention is not limited thereto. For those skilled in the art, various variations and modifications which are made without departing from the spirit and the scope of the invention shall fall within the scope of the invention.

What is claimed is:

1. A mounting film for a liquid crystal drive chip, wherein
the mounting film is provided with a slit at a side edge thereof; and
when a distance between a liquid crystal display panel and a control circuit substrate of the liquid crystal display unit is un-uniform, the opening degree of the slit is variable accordingly to accommodate variations in the distance.

2. The mounting film according to claim 1, wherein
the mounting film is rectangular, and
the slit is provided on either of the two side edges, which are arranged between the liquid crystal display panel and the control circuit substrate, of the rectangular mounting film.

3. The mounting film according to claim 2, wherein
a circular through hole is formed at the tip of the slit.

4. The mounting film according to claim 1, wherein
the slit is configured to be substantially parallel to an engaging side edge of the mounting film with the liquid crystal display panel or the control circuit substrate.

5. The mounting film according to claim 1, wherein
a region around the slit is coated with solder resist and/or provided with dummy wirings to optimize the slit.

6. A mounting film for a liquid crystal drive chip, wherein
the mounting film is provided with a weakened line;
when forces are applied to the mounting film, a slit will be formed in the mounting film along the weakened line, and when a distance between a liquid crystal display panel and a control circuit substrate of the liquid crystal display unit is un-uniform, the opening degree of the slit is variable accordingly to accommodate variations in the distance.

7. The mounting film according to claim 6, wherein
the mounting film is rectangular, and
one end of the weakened line is provided on either of the two side edges, which are arranged between the liquid crystal display panel and the control circuit substrate, of the rectangular mounting film.

8. The mounting film according to claim 6, wherein
a circular through hole is formed at the tip of weakened line.

9. The mounting film according to claim 6, wherein
the weakened line is configured to be substantially parallel to an engaging side edge of the mounting film with the liquid crystal display panel or the control circuit substrate.

10. The mounting film according to claim 6, wherein
a region around the weakened line is coated with solder resist and/or provided with dummy wirings to optimize the slit formed along the weakened line.

11. A mounting film for a liquid crystal drive chip, having a substantial rectangular shape with a pair of opposite longitudinal edges and a pair of opposite latitudinal edges, the film comprising:
a pair of opposite interface regions located near to the opposite longitudinal edges, respectively;
a region for mounting on the liquid crystal drive chip; and
a wiring region for electrically connecting the liquid crystal drive chip and the interface regions;
wherein a pair of slits or weakened lines are provided at the opposite latitudinal edges respectively and outside of the interface regions and the wiring region, an extending direction of the slits or weakened lines is substantially parallel to the longitudinal edges, and wherein when applying a moderate force on the film along a longitudinal direction, a length of the film in the longitudinal direction is variable due to the opening of the slits or the weakened lines being broken to form the slits.

12. A mounting film for a liquid crystal drive chip, having a substantial rectangular shape with a pair of opposite longitudinal edges and a pair of opposite latitudinal edges, the film comprising:
a pair of opposite interface regions located near to the opposite longitudinal edges, respectively;
a region for mounting on the liquid crystal drive chip; and
a wiring region for electrically connecting the liquid crystal drive chip and the interface regions;
wherein a pair of slits or weakened lines are provided at the opposite latitudinal edges respectively and outside of the interface regions and the wiring region, an extending direction of the slits or weakened lines is substantially parallel to the longitudinal edges, and wherein a through hole is formed at the tip of each slit or weakened line.

* * * * *